United States Patent
Ishitani et al.

(10) Patent No.: US 10,741,318 B2
(45) Date of Patent: *Aug. 11, 2020

(54) SPIN CURRENT MAGNETIZATION ROTATIONAL ELEMENT, SPIN-ORBIT-TORQUE MAGNETORESISTANCE EFFECT ELEMENT, MAGNETIC MEMORY, AND HIGH-FREQUENCY MAGNETIC ELEMENT

(71) Applicant: TDK CORPORATION, Tokyo (JP)

(72) Inventors: Yugo Ishitani, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,846

(22) Filed: Aug. 23, 2018

(65) Prior Publication Data

US 2019/0074124 A1 Mar. 7, 2019

(30) Foreign Application Priority Data

Sep. 5, 2017 (JP) .................. 2017-170369
Jun. 8, 2018 (JP) .................. 2018-110604

(51) Int. Cl.
*H01L 43/08* (2006.01)
*H01L 27/22* (2006.01)
(Continued)

(52) U.S. Cl.
CPC .......... *H01F 10/329* (2013.01); *G11C 11/161* (2013.01); *G11C 11/1675* (2013.01);
(Continued)

(58) Field of Classification Search
CPC ......... H01L 43/08; H01L 43/06; H01L 43/02; H01L 43/14; H01L 27/226;
(Continued)

(56) References Cited

U.S. PATENT DOCUMENTS 8,350,347 B2 1/2013 Gaudin et al.
2008/0074802 A1* 3/2008 Carey .................... B82Y 25/00
360/324.1
(Continued)

FOREIGN PATENT DOCUMENTS

WO 2016/021468 A1 2/2016

OTHER PUBLICATIONS

Fukami et al. A spin-orbit torque switching scheme with collinear magnetic easy axis and current configuration. Nature Nanotechnology, pp. 1-5, 2016.*

(Continued)

*Primary Examiner* — Galina G Yushina
(74) *Attorney, Agent, or Firm* — Oliff PLC

(57) ABSTRACT

A spin current magnetization rotational element is provided in which deterioration in the degree of integration is prevented from being caused and a magnetization rotation can be easily realized. A spin current magnetization rotational element includes a spin-orbit torque wiring which extends in a first direction, a first ferromagnetic layer which is laminated in a second direction intersecting the first direction; and a first magnetic field applying layer which is disposed to be separated from the first ferromagnetic layer in the first direction and configured to apply an assistant magnetic field assisting a magnetization rotation of the first ferromagnetic layer to the first ferromagnetic layer.

12 Claims, 11 Drawing Sheets

(51) Int. Cl.
  *H01L 43/02* (2006.01)
  *H01F 10/32* (2006.01)
  *H01L 43/06* (2006.01)
  *G11C 11/16* (2006.01)
  *H03H 11/04* (2006.01)

(52) U.S. Cl.
  CPC ..... *H01F 10/3254* (2013.01); *H01F 10/3286* (2013.01); *H01L 27/222* (2013.01); *H01L 43/02* (2013.01); *H01L 43/06* (2013.01); *H01L 43/08* (2013.01); *H03H 11/04* (2013.01)

(58) Field of Classification Search
  CPC . G11C 11/1675; G11C 11/161; H01F 10/329; H01F 10/3286; H01F 10/3254; H03H 11/04
  See application file for complete search history.

(56) References Cited

U.S. PATENT DOCUMENTS

| | | | |
|---|---|---|---|
| 2009/0034131 A1* | 2/2009 | Yamada | B82Y 25/00 360/319 |
| 2009/0140733 A1* | 6/2009 | Koga | B82Y 25/00 324/252 |
| 2010/0091555 A1 | 4/2010 | Fukami | |
| 2012/0281467 A1* | 11/2012 | Abraham | G11C 11/1675 365/171 |
| 2015/0084972 A1* | 3/2015 | Wu | G09G 3/2096 345/520 |
| 2015/0348606 A1 | 12/2015 | Buhrman et al. | |
| 2016/0247550 A1* | 8/2016 | Fukami | H01L 43/02 |
| 2016/0300999 A1 | 10/2016 | Yi et al. | |
| 2017/0222135 A1 | 8/2017 | Fukami et al. | |
| 2019/0074123 A1* | 3/2019 | Sasaki | H01F 10/329 |

OTHER PUBLICATIONS

Y. K. Kato et al., "Observation of the Spin Hall Effect in Semiconductors," Science, vol. 306, 1910-1913, 2004.
Guoqiang Yu et al., "Switching of Perpendicular Magnetization by Spin-Orbit Torques in the Absence of External Magnetic Fields," nature nanotechnology, DOI:10.1038/Nnano.2014.94, vol. 9, 548-554, 2014.
S. Fukami et al., "A Spin-Orbit Torque Switching Scheme with Collinear Magnetic Easy Axis and Current Configuration," nature nanotechnology, 11, 621, 6 pages, 2016.
I. M. Miron et al., "Perpendicular Switching of a Single Ferromagnetic Layer Induced by In-plane Current Injection," Nature, vol. 476,189-194, 2011.
L. Liu et al., "Spin Torque Switching with the Giant Spin Hall Effect of Tantalum" and Supporting Online Material, Science, 336, 555, 2012.
L. Liu et al., "Current-Induced Switching of Perpendicular Magnetized Layers Using Spin Torque from the Spin Hall Effect," Physical Review Letters, 109, 096602-1 to 096602-5, 2012.
KS. Lee et al., "Threshold Current for Switching of a Perpendicular Magnetic Layer Induced by Spin Hall Effect," Applied Physics Letters, 102, 112410, 17 pages, 2013.
KS. Lee et al., "Thermally Activated Switching of Perpendicular Magnet by Spin-Orbit Torque," Applied Physics Letters, 104, 072413-1 to 072413-5, 2014.
S. Fukami et al., "Magnetization Switching by Spin-Orbit Torque in an Antiferromagnet-ferromagent bilayer system," nature materials, 15, 535-542, 2016.
S. Takahashi et al., "Spin Injection and Detection in Magnetic Nanostructures," Physical Review B 67, 052409-1 to 052409-4, 2003.
Y. Seo et al., "Area-Efficient SOT-MRAM with a Schottky Diode," IEEE Electron Device Letters, vol. 37, No. 8, p. 982-985, 2016.
W. Zhang et al., "Spin Hall Effects in Metallic Antiferromagnets," Physical Review Letters, 113, 196602-1 to 196602-6, 2014.
Feb. 18, 2020 Office Action issued in U.S. Appl. No. 16/101,949.

* cited by examiner

SPIN CURRENT MAGNETIZATION ROTATIONAL ELEMENT, SPIN-ORBIT-TORQUE MAGNETORESISTANCE EFFECT ELEMENT, MAGNETIC MEMORY, AND HIGH-FREQUENCY MAGNETIC ELEMENT

TECHNICAL FIELD

The present disclosure relates to a spin current magnetization rotational element, a spin-orbit-torque magnetoresistance effect element, a magnetic memory, and a high-frequency magnetic element.

Priority is claimed on Japanese Patent Application No. 2017-170369, filed on Sep. 5, 2017, and Japanese Patent Application No. 2018-110604, filed on Jun. 8, 2018, the contents of which are incorporated herein by reference.

BACKGROUND ART

A giant magnetoresistance (GMR) element constituted of a multilayer film having a ferromagnetic layer and a nonmagnetic layer, and a tunneling magnetoresistance (TMR) element using an insulating layer (tunnel barrier layer, barrier layer) as a nonmagnetic layer are known as a magnetoresistance effect element. Generally, a TMR element has high element resistance and a high magnetoresistance (MR) ratio compared to a GMR element. Therefore, the TMR element has attracted attention as an element for a magnetic sensor, a high-frequency component, a magnetic head, and a nonvolatile magnetic random-access memory (MRAM).

The MRAM reads and writes data utilizing the characteristic that the element resistance of a TMR element changes when orientations of magnetizations of two ferromagnetic layers sandwiching an insulating layer therebetween change. As a writing method of an MRAM, a writing method utilizing a magnetic field made by a current (magnetization rotation), and a writing method utilizing a spin-transfer torque (STT) caused when a current flows in a lamination direction of a magnetoresistance effect element (magnetization rotation) are known.

A magnetization rotation of a TMR element using an STT is efficient when considered from the viewpoint of efficiency in energy. However, the rotational current density for a magnetization rotation is high. It is desirable that the rotational current density be low from the viewpoint of extending the life of a TMR element. The same applies to a GMR element as well.

Recently, a magnetization rotation utilizing a pure spin current generated through spin orbit interaction as means of reducing a rotational current has attracted attention (for example, Non-Patent Document 1 in I. M. Miron, K. Garello, G Gaudin, PJ. Zermatten, MV. Costache, S. Auffret, S. Bandiera, B. Rodmacq, A. Schuhl, and P. Gambardella, Nature, 476, 189 (2011)). This mechanism has not been sufficiently elucidated. However, it is assumed that a pure spin current caused due to the spin orbit interaction or the Rashba effect at the interface between different materials induces a spin-orbit torque (SOT), and a magnetization rotation is caused. A pure spin current is generated when the same number of electrons of an upward spin and electrons of a downward spin flow in orientations opposite to each other, and a flow of electric charge is offset. Therefore, a current flowing in a magnetoresistance effect element is zero, and an extended life for the magnetoresistance effect element is expected.

On the other hand, it is said that a magnetization rotation using an SOT needs to disrupt the symmetry of a magnetization causing a magnetization rotation, by applying an external magnetic field (for example, Non-Patent Document 2 in S. Fukami, T. Anekawa, C. Zhang, and H. Ohno, Nature Nanotechnology, DOI: 10. 1038/NNANO. 2016. 29). In order to apply an external magnetic field, a generation source for an external magnetic field is required. A generation source for an external magnetic field provided separately outside leads to deterioration in the degree of integration of an integrated circuit including a spin current magnetization rotational element. Therefore, a technique of enabling a magnetization rotation using an SOT without applying an external magnetic field is also being studied.

For example, Non-Patent Document 3 in Guoqiang Yu, et al., Nature Nanotechnology, DOI: 10. 1038/NNANO. 2014. 94 discloses that the symmetry of the intensity of a magnetization collapses due to changing of the oxygen content of an oxide film bonded to a ferromagnetic material causing a magnetization rotation. When the symmetry of the intensity of a magnetization collapses, a magnetization rotation is likely to occur, so that a magnetization rotation using an SOT can be performed even if there is no magnetic field.

SUMMARY

However, a method disclosed in Non-Patent Document 3 in Guoqiang Yu, et al., Nature Nanotechnology, DOI: 10. 1038/NNANO. 2014. 94 has a problem in that it is difficult to control the oxygen content. Particularly, in each of elements simultaneously manufactured in a thin-film process, it is difficult to form oxygen content gradients similar to each other for the elements in mass production. In addition, if the magnitude of magnetic anisotropy differs in an in-plane direction of a magnetoresistance effect element, when an unintended external force (external magnetic field, heat, and the like) is applied, there are cases in which a magnetization of a portion having little magnetic anisotropy rotates. A rotation of an unintended magnetization becomes noise in data and hinders long-term storage of data. Particularly, in a case in which the size of a ferromagnetic material of a magnetoresistance effect element is a size which can form a magnetic wall, a magnetization rotation of a portion having little magnetic anisotropy also induces a magnetization rotation of other portions. Accordingly, there is concern that data may be rewritten.

In addition, as a structure for disrupting the symmetry of a magnetization causing a magnetization rotation, it is conceivable to use a structure in which a wiring is formed inside a circuit forming an element and a magnetic field assisting a magnetization rotation is generated from the wiring. However, when a structure assisting a magnetization rotation by utilizing a wiring is used, there is problem in that more electricity is consumed due to the wiring and the degree of integration of a circuit deteriorates in order to form the wiring.

The present disclosure has been made in consideration of the foregoing problems, and an object thereof is to provide a spin current magnetization rotational element which is configured to be able to induce a magnetization rotation without causing an increase in consumption of electricity and a spin current magnetization rotational element which does not cause deterioration in degree of integration.

In addition, another object of the present disclosure is to provide a magnetoresistance effect element including this excellent spin current magnetization rotational element, a magnetic memory, and a high-frequency magnetic element.

Solution to Problem

As a result of intensive investigation, the inventors have found that when a magnetic field applying part, which generates a regular magnetic field even if a current or the like does not flow, is embedded in an element, a magnetization rotation can be easily caused by utilizing a spin-orbit torque (SOT) without deterioration in integration properties being caused.

That is, in order to solve the problems described above, the present disclosure provides the following means.

(1) According to a first aspect, a spin current magnetization rotational element is provided, including a spin-orbit torque wiring which extends in a first direction, a first ferromagnetic layer which is laminated in a second direction intersecting the first direction, and a first magnetic field applying layer which is disposed to be separated from the first ferromagnetic layer in the first direction and configured to apply an assistant magnetic field assisting a magnetization rotation of the first ferromagnetic layer to the first ferromagnetic layer.

(2) In the spin current magnetization rotational element according to the aspect described above, an axis of easy magnetization of the first ferromagnetic layer may be in the second direction.

(3) In the spin current magnetization rotational element according to the aspect described above, an axis of easy magnetization of the first magnetic field applying layer may be in the first direction, and a magnetic field generated by the first magnetic field applying layer may have at least a component in the first direction.

(4) In the spin current magnetization rotational element according to the aspect described above, the spin-orbit torque wiring and the first magnetic field applying layer may be in contact with each other.

(5) In the spin current magnetization rotational element according to the aspect described above, a distance between the first ferromagnetic layer and the first magnetic field applying layer may be equal to or shorter than a spin diffusion length of the spin-orbit torque wiring.

(6) In the spin current magnetization rotational element according to the aspect described above, a surface area of the first magnetic field applying layer projected in the first direction with respect to a first surface extending along the second direction may be larger than a surface area of the first ferromagnetic layer projected in the first direction with respect to the first surface.

(7) The spin current magnetization rotational element according to the aspect described above may further include second magnetic field applying layer configured to generate a magnetic field having at least a component in the first direction, the first ferromagnetic layer being sandwiched between the second magnetic field applying layer and the first magnetic field applying layer.

(8) The spin current magnetization rotational element according to the aspect described above may further include via wirings which extend in the second direction respectively from at least two points sandwiching the first ferromagnetic layer on the spin-orbit torque wiring.

(9) The spin current magnetization rotational element according to the aspect described above may further include magnetic shield layers which sandwich the spin-orbit torque wiring and the first ferromagnetic layer in the second direction.

(10) According to a second aspect, a spin-orbit-torque magnetoresistance effect element is provided, including the spin current magnetization rotational element according to the aspect described above, a nonmagnetic layer which is laminated on a surface on a side opposite to a surface in contact with the spin-orbit torque wiring in the first ferromagnetic layer, and a second ferromagnetic layer, the nonmagnetic layer being sandwiched between the second ferromagnetic layer and the first ferromagnetic layer.

(11) According to a third aspect, a magnetic memory is provided, including a plurality of spin-orbit-torque magnetoresistance effect elements according to the aspect described above.

(12) The magnetic memory according to the aspect described above may further include an element part in which the plurality of spin-orbit-torque magnetoresistance effect elements are arranged, and a magnetic field applying part which is positioned in an outer periphery of the element part and configured to uniformize magnetic fields in a middle part and a peripheral edge part of the element part.

(13) According to a fourth aspect, a high-frequency magnetic element is provided, including the spin-orbit-torque magnetoresistance effect element according to the aspect described above.

According to the spin current magnetization rotational element of the aspect described above, it is possible to provide a spin current magnetization rotational element which can perform a magnetization rotation without increasing consumption of electricity and deterioration in the degree of integration is not caused. In addition, it is possible to provide a magnetoresistance effect element, a magnetic memory, and a high-frequency magnetic element including such an excellent spin current magnetization rotational element.

DETAILED DESCRIPTION

Figure 1:
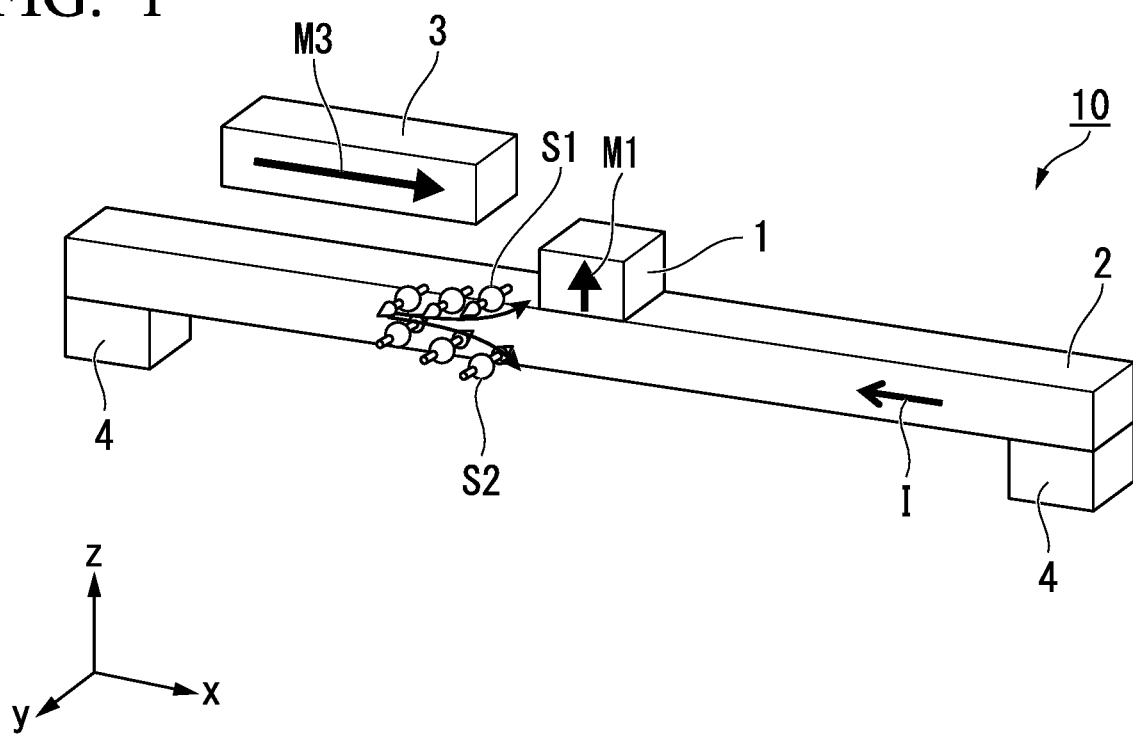
FIG. 1 is a perspective view schematically illustrating a spin current magnetization rotational element according to a first embodiment.

Hereinafter, the present embodiment will be described in detail with reference to the drawings. In the drawings used in the following description, in order to make the features easier to understand, characteristic portions may be illustrated in an enlarged manner for the sake of convenience, and the dimensional proportions of each constituent element may be different from the actual ones. The materials, dimensions, and the like exemplified in the following description are merely examples. The present disclosure is not limited thereto and can be realized by suitable changes within a range in which the effects of the present disclosure are exhibited.

First Embodiment

FIG. 1 is a perspective view schematically illustrating a spin current magnetization rotational element according to a first embodiment.

A spin current magnetization rotational element 10 according to the first embodiment has a first ferromagnetic layer 1, a spin-orbit torque wiring 2, a first magnetic field applying layer 3, and via wirings 4. In the spin current magnetization rotational element 10 illustrated in FIG. 1, the first ferromagnetic layer 1 having the same width as the spin-orbit torque wiring 2 and having a rectangular shape in a plan view is laminated in a middle part on an upper surface of the belt-shaped spin-orbit torque wiring 2. In addition, the first magnetic field applying layer 3 has a width and a length equal to those of the first ferromagnetic layer 1 in a plan view and is disposed to be separated from the first ferromagnetic layer 1 and the spin-orbit torque wiring 2.

Hereinafter, description will be given while defining a first direction in which the spin-orbit torque wiring 2 extends as an x-direction, a lamination direction (second direction) of the first ferromagnetic layer 1 as a z-direction, and a direction orthogonal to both the x-direction and the z-direction as a y-direction.

<First Ferromagnetic Layer>

The first ferromagnetic layer 1 functions when the magnetization orientation thereof relatively changes.

As a material of the first ferromagnetic layer 1, a ferromagnetic material, particularly a soft-magnetic material, can be applied. For example, it is possible to use a metal selected from the group consisting of Cr, Mn, Co, Fe, and Ni, an alloy containing one or more kinds of these metals, and an alloy containing these metals and at least one element from B, C, and N. Specifically, Co—Fe, Co—Fe—B, and Ni—Fe can be exemplified.

An axis of easy magnetization of the first ferromagnetic layer 1 is in the z-direction, and a magnetization M1 of the first ferromagnetic layer 1 is oriented in the z-direction. Here, an orientation direction of the magnetization M1 is not limited to a case of completely coinciding with the z-direction and may be deviated from the z-direction within a range of exhibiting the effect. A perpendicular magnetization film in which the magnetization M1 is oriented in the z-direction can have many magnetizations within the same surface area (xy plane), thereby having excellent integration properties.

<Spin-Orbit Torque Wiring>

The spin-orbit torque wiring 2 extends in the x-direction. The spin-orbit torque wiring 2 is connected to one surface of the first ferromagnetic layer 1 in the z-direction. The spin-orbit torque wiring 2 may be directly connected to the first ferromagnetic layer 1 or may be connected thereto with a different layer such as a cap layer interposed therebetween.

The spin-orbit torque wiring 2 is formed of a material in which a pure spin current is generated due to a spin Hall effect when a current flows. The material need only have a configuration in which a pure spin current is generated in the spin-orbit torque wiring 2. Therefore, the material is not limited to a material consisting of a single chemical element. The spin-orbit torque wiring 2 may be constituted of a portion formed of a material which easily generates a pure spin current and a portion formed of a material with which it is difficult for a pure spin current to be generated.

The spin Hall effect is a phenomenon in which a pure spin current is induced in a direction orthogonal to the orientation of a current based on a spin orbit interaction when a current flows in the material. A mechanism in which a pure spin current is generated due to the spin Hall effect will be described.

As illustrated in FIG. 1, when a potential difference occurs between both ends of the spin-orbit torque wiring 2 in the x direction, a current I flows in the x direction. When the current I flows, a first spin S1 oriented in a +y direction and a second spin S2 oriented in a −y direction are each bent in a direction which is orthogonal to a direction of the current I. An ordinary Hall effect and the spin Hall effect are in common with each other in that a motion (movement) direction of electric charge (electrons) causing a motion (movement) is bent. However, in the ordinary Hall effect, a charged particle causing a motion in a magnetic field receives a Lorentz force and the motion direction thereof is bent. In contrast, the spin Hall effect is significantly different therefrom in that the movement direction is bent when electrons move only (a current flows only) even if no magnetic field is present.

In a nonmagnetic material (material which is not a ferromagnetic material), the number of electrons of the first spin S1 and the number of electrons of the second spin S2 are equal to each other. Accordingly, in the diagram, the number of electrons of the first spin S1 oriented in an upward direction and the number of electrons of the second spin S2 oriented in a downward direction are equal to each other. Therefore, the current as a net flow of electric charge is zero. In particular, spin current which is not accompanied by a current is called a pure spin current.

When a current flows in a ferromagnetic material, the first spin S1 and the second spin S2 are bent in directions opposite to each other in the same manner. On the other hand, in a ferromagnetic material, any of the first spin S1 and the second spin S2 is in a state where there is a greater amount thereof. As a result, this is different in that a net flow of electric charge is caused (a voltage is generated). Therefore, a material of the spin-orbit torque wiring 2 does not include a material constituted of only a ferromagnetic material.

Here, when a flow of electrons of the first spin S1 is expressed as $J_\uparrow$, a flow of electrons of the second spin S2 is expressed as $J_\downarrow$, and a spin current is expressed as $J_S$, the relationship therebetween is defined as $J_S = J_\uparrow - J_\downarrow$. In FIG. 1, $J_S$ as a pure spin current flows in the z-direction in the diagram. Here, $J_S$ is a flow of electrons in which the polarizability is 100%.

In FIG. 1, when a ferromagnetic material is brought into contact with the upper surface of the spin-orbit torque wiring 2, a pure spin current diffuses and flows into the ferromagnetic material. That is, a spin is injected into the first ferromagnetic layer 1.

As a material of a spin-orbit torque wiring, it is possible to use a material selected from the group consisting of tungsten, rhenium, osmium, iridium, and an alloy containing at least one of these metals. In addition, tungsten, rhenium, osmium, and iridium have 5d electrons in the outermost shell and have a large orbital angular momentum when five d-orbitals are degenerated. Therefore, the spin orbit interaction causing the spin Hall effect increases, so that a spin current can be efficiently generated.

The spin-orbit torque wiring 2 may contain a nonmagnetic heavy metal. Here, a heavy metal refers to a metal having specific gravity equal to or higher than that of yttrium. The spin-orbit torque wiring 2 may be formed of only a nonmagnetic heavy metal.

In this case, it is preferable that a nonmagnetic heavy metal be a nonmagnetic metal of a high atomic number, that is, the atomic number 39 or higher having d-electrons or f-electrons in the outermost shell. The reason for this is that such a nonmagnetic metal has significant spin orbit interaction causing the spin Hall effect. The spin-orbit torque wiring 2 may be formed of only a nonmagnetic metal of a high atomic number, that is, the atomic number 39 or higher having d-electrons or f-electrons in the outermost shell.

Normally, when a current flows in a metal, all the electrons move in a direction opposite to that of the current regardless of the spin orientation thereof. In contrast, since a nonmagnetic metal of a high atomic number having d-electrons or f-electrons in the outermost shell has significant spin orbit interaction, a direction in which electrons move due to the spin Hall effect depends on the orientation of an electron spin, so that the pure spin current $J_S$ is easily generated. Particularly, when Ir is used as a nonmagnetic heavy metal, the spin Hall effect increases. Moreover, it is possible to apply perpendicular magnetic anisotropy greater than that of a material in the related art to the first ferromagnetic layer 1, at the interface between Ir and the first ferromagnetic layer 1.

In addition, the spin-orbit torque wiring 2 may contain a magnetic metal. A magnetic metal indicates a ferromagnetic metal or an antiferromagnetic metal. When a nonmagnetic metal contains a very small amount of magnetic metal, the spin orbit interaction is strengthened, so that the efficiency of generating a spin current with respect to a current flowing in the spin-orbit torque wiring 2 is enhanced. The spin-orbit torque wiring 2 may be formed of only an antiferromagnetic metal.

The spin orbit interaction is caused due to the unique internal magnetic field of the substance in the material of the spin-orbit torque wiring. Therefore, a pure spin current is caused even in a nonmagnetic material. When a very small amount of magnetic metal is added to the material of the spin-orbit torque wiring, the magnetic metal itself scatters the spin of flowing electrons. Accordingly, the efficiency of generating a spin current is improved. However, if the added amount of magnetic metal excessively increases, a generated pure spin current is scattered by the added magnetic metal. As a result, an operation of reducing a spin current becomes stronger.

Therefore, it is preferable that the molar ratio of a magnetic metal to be added be sufficiently smaller than the molar ratio of a main component of a pure spin generation part in the spin-orbit torque wiring. As a guide, it is preferable that the molar ratio of a magnetic metal to be added be 3% or lower.

In addition, the spin-orbit torque wiring 2 may include a topological insulator. The spin-orbit torque wiring 2 may be constituted of only a topological insulator. A topological insulator is a substance in which the inside of the substance is an insulator or a high resistance material but a spin-polarized metal state is provided on the surface thereof. The substance has an internal magnetic field such as a spin orbit interaction. Therefore, even if there is no external magnetic field, a new topological phase is manifested due to the effect of the spin orbit interaction. This is a topological insulator, and a pure spin current can be generated in a highly efficient manner due to the strong spin orbit interaction and collapse of the rotational symmetry at the edge.

For example, as a topological insulator, it is preferable to use SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like. Topological insulators can generate a spin current in a highly efficient manner.

<First Magnetic Field Applying Layer>

The first magnetic field applying layer 3 is provided to apply a magnetic field having a component in the x-direction in FIG. 1 to the first ferromagnetic layer 1. The first magnetic field applying layer 3 is disposed to be separated from the first ferromagnetic layer 1 in the x-direction. That is, when seen from the first ferromagnetic layer 1 (having the first ferromagnetic layer 1 as the criterion), the first ferromagnetic layer 1 and the first magnetic field applying layer 3 are disposed to be separated from each other in the x-direction. It is preferable that a distance between the first ferromagnetic layer 1 and the first magnetic field applying layer 3 be narrowed to the extent that the magnetization M1 of the first ferromagnetic layer 1 does not waver due to a magnetic field generated by the first magnetic field applying layer 3.

The first magnetic field applying layer 3 is constituted of a ferromagnetic material having high coercivity. In FIG. 1, a magnetization M3 of the first magnetic field applying layer 3 is oriented in the x-direction of the directions within the xy plane. Here, the orientation direction of the magnetization M3 is not limited to a case of completely coinciding with the x-direction and may be deviated from the x-direction within a range of exhibiting the effect. For example, CoCrPt, a Fe—Co alloy, a Heusler alloy, or ferrite oxide can be used as the first magnetic field applying layer 3.

It is preferable that the length of the first magnetic field applying layer 3 in the x-direction be longer than the length (width) in the y-direction and the length (thickness) in the z-direction. The magnetization M3 of the first magnetic field applying layer 3 is easily oriented in a long axis direction of the first magnetic field applying layer 3. When the first magnetic field applying layer 3 extends in the x-direction, the magnetization M3 is stably oriented in the x-direction, and an x-component of the magnetic field applied to the first ferromagnetic layer 1 can be increased.

<Via Wiring>

The via wirings 4 are provided at positions sandwiching the first ferromagnetic layer 1 in the spin-orbit torque wiring 2. The via wirings 4 extend in the z-direction and perform connection with respect to a semiconductor element and the like. The via wirings 4 illustrated in FIG. 1 extend in a direction opposite to that of the first magnetic field applying layer 3 (negative z-direction) from the spin-orbit torque wiring 2. However, the via wirings 4 may extend in a direction in which the first magnetic field applying layer 3 is present (z-direction).

A material having excellent conductivity can be used as the via wiring 4. For example, copper, aluminum, and silver can be used as the via wiring 4. When the spin current magnetization rotational element 10 is used alone, no via wiring 4 may be provided.

In addition, the spin current magnetization rotational element 10 may have a constituent element other than the first ferromagnetic layer 1, the spin-orbit torque wiring 2, the first magnetic field applying layer 3, and the via wirings 4. For example, in an actual element, the first magnetic field applying layer 3 is laminated with an interlayer insulating film interposed therebetween, instead of floating at a position in the spin-orbit torque wiring 2 in the z-direction. A material similar to that used in a semiconductor device or the like can be used as the interlayer insulating film. For example, silicon oxide ($SiO_x$), silicon nitride ($SiN_x$), silicon carbide (SiC), chromium nitride (CrN), silicon carbonitride (SiCN), silicon oxynitride (SiON), aluminum oxide ($Al_2O_3$), or zirconium oxide ($ZrO_x$) is used.

In addition thereto, a substrate or the like may be included as a supporter. The substrate preferably has excellent flatness. For example, S1 or AlTiC can be used as a material.

The present embodiment is not necessarily limited to the configuration described above, and various changes can be applied thereto within a range not departing from the gist.

(Principle of Spin Current Magnetization Rotational Element)

Next, the principle of the spin current magnetization rotational element 10 will be described, and a reason that the magnetization M1 of the first ferromagnetic layer 1 can perform a magnetization rotation due to a magnetic field generated from the first magnetic field applying layer 3 and a spin injected from the spin-orbit torque wiring 2 will be described.

As illustrated in FIG. 1, when the current I is applied to the spin-orbit torque wiring 2, the first spin S1 and the second spin S2 are bent due to the spin Hall effect. As a result, the pure spin current $J_S$ is caused in the z-direction.

The first ferromagnetic layer 1 is installed in the z-direction of the spin-orbit torque wiring 2. Therefore, a spin is injected into the first ferromagnetic layer 1 from the spin-orbit torque wiring 2. An injected spin applies a spin-orbit torque (SOT) to the magnetization M1 of the first ferromagnetic layer 1.

Since the first spin S1 injected into the first ferromagnetic layer 1 is oriented in the y-direction, a torque (spin-orbit torque) in the y-direction is applied to the magnetization M1, and the magnetization M1 is rotated by 90° toward the y-direction. Whether or not the magnetization M1 rotated by 90° returns in the z-direction or is oriented in the negative z-direction (causes a magnetization rotation) is determined in a probabilistic manner in a state in which no first magnetic field applying layer 3 is provided and no magnetic field is applied to the first ferromagnetic layer 1. That is, whether or not to cause a magnetization rotation is determined by probability and does not stably function as an element. In contrast, when a magnetic field from the first ferromagnetic layer 1 is applied to the first magnetic field applying layer 3, rotational probability of the magnetization M1 rotated by 90° due to the spin-orbit torque has asymmetry. As a result, the magnetization M1 rotated by 90° due to the spin-orbit torque can stably make a magnetization rotation with low energy.

As described above, according to the spin current magnetization rotational element 10 of the first embodiment, the first magnetic field applying layer 3 is included inside the element. Therefore, even if no magnetic field is applied from the outside of the element, a magnetization rotation can be easily performed. In addition, the first magnetic field applying layer 3 continuously applies a magnetic field in a constant direction to the first ferromagnetic layer 1. Therefore, a wiring or the like for generating a magnetic field is not required. Therefore, the spin current magnetization rotational element 10 according to the first embodiment has excellent integration properties and can stably and easily perform a magnetization rotation.

The spin current magnetization rotational element 10 according to the first embodiment described above can be applied to a nonvolatile magnetic random-access memory (MRAM), a high-frequency component, a magnetic sensor, or the like. For example, the spin current magnetization rotational element 10 can be used as a magnetic anisotropy sensor or an optical element utilizing a magnetic Kerr effect or a magnetic Faraday effect.

Second Embodiment

Figure 2:
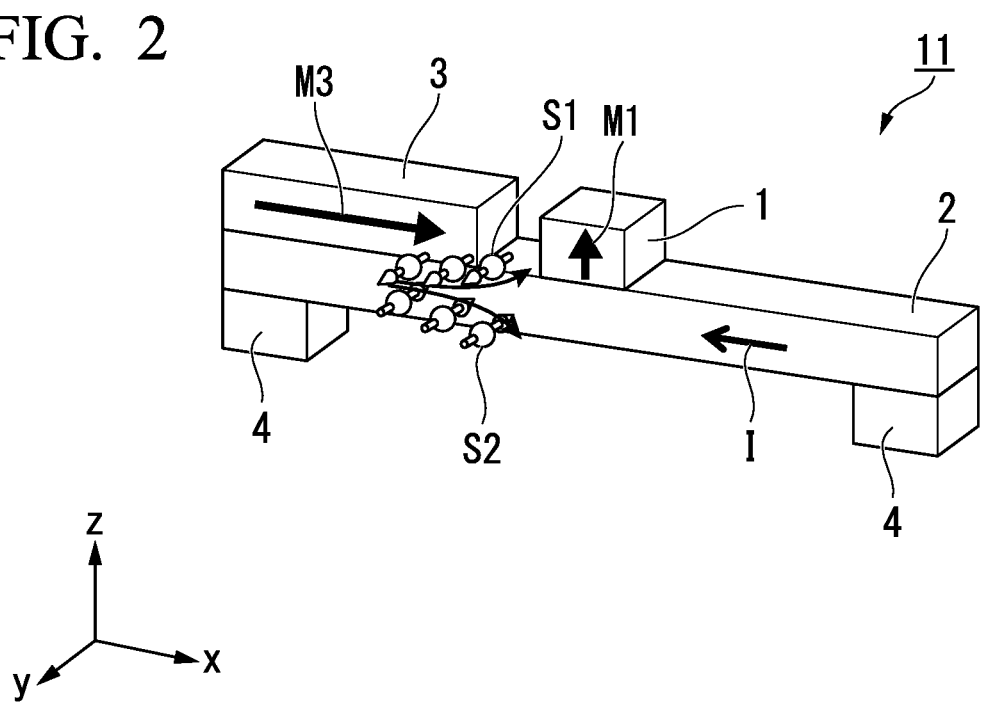
FIG. 2 is a perspective view schematically illustrating a spin current magnetization rotational element according to a second embodiment.

A spin current magnetization rotational element 11 according to the second embodiment illustrated in FIG. 2 is different from the spin current magnetization rotational element 10 according to the first embodiment in that the first magnetic field applying layer 3 and the spin-orbit torque wiring 2 are in contact with each other. Other configurations are the same as those of the spin current magnetization rotational element 10 according to the first embodiment. The same reference signs are applied to the same configurations, and description thereof is omitted.

The spin-orbit torque wiring 2 containing a heavy metal has high electric resistance. When the first magnetic field applying layer 3 is a metal, heat generation due to the current I can be minimized by connecting the first magnetic field applying layer 3 formed of a metal having low resistance to the spin-orbit torque wiring 2.

In addition, a magnetization rotation of the spin current magnetization rotational element 11 utilizing a spin-orbit torque (SOT) depends on the amount of injected spin. The amount of spin is determined based on the current density of the current I. The current density of the current I is a result obtained by dividing the current I by the surface area of a surface of the spin-orbit torque wiring 2 immediately below the first ferromagnetic layer 1 cut on a surface orthogonal to a flowing direction of the current. The current I flowing in the first magnetic field applying layer 3 is integrated in the spin-orbit torque wiring 2 immediately below the first ferromagnetic layer 1. Even if the first magnetic field applying layer 3 is connected to the spin-orbit torque wiring 2, the current density does not decrease.

In addition, since the current I flows inside the first magnetic field applying layer 3, the current I is spin-polarized. When a polarized spin is injected into the first ferromagnetic layer 1, a spin-transfer torque (STT) is applied to the magnetization M1 of the first ferromagnetic layer 1. That is, the spin-transfer torque (STT) assisting the spin-orbit torque (SOT) is applied to the magnetization M1 of the first ferromagnetic layer 1 in an overlapping manner, and the rotational current density required to rotate the magnetization M1 of the first ferromagnetic layer 1 decreases.

It is preferable that the distance between the first ferromagnetic layer 1 and the first magnetic field applying layer 3 be equal to or shorter than a spin diffusion length of the spin-orbit torque wiring 2. When the relationship is satisfied, a polarized spin can be efficiently injected into the first ferromagnetic layer 1.

Figure 3:
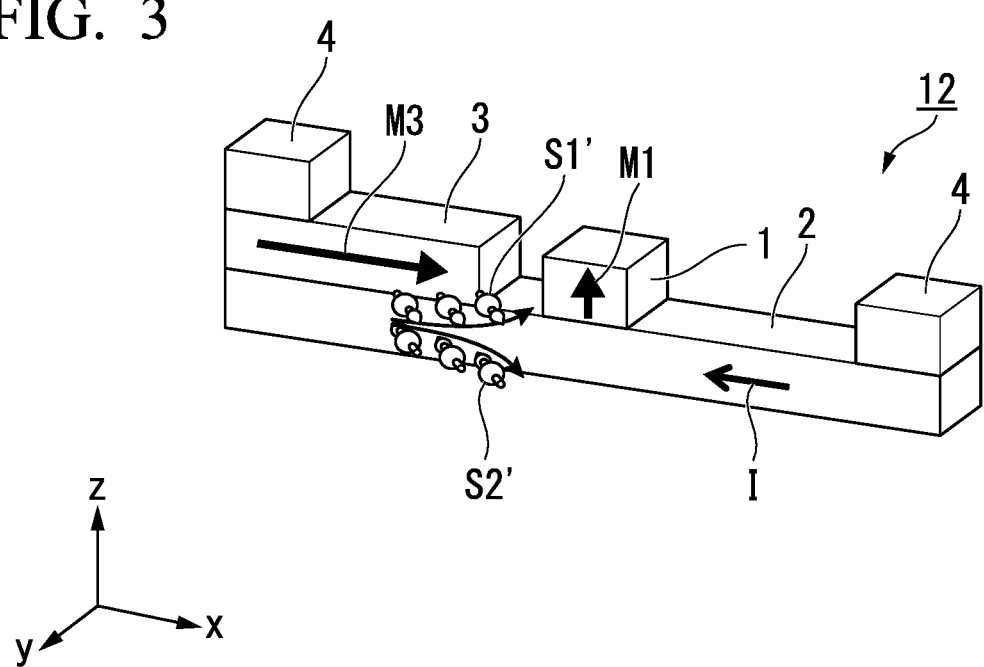
FIG. 3 is a perspective view schematically illustrating another example of the spin current magnetization rotational element according to the second embodiment.

In addition, FIG. 3 is a perspective view schematically illustrating a modification example of the spin current magnetization rotational element according to the second embodiment. In a spin current magnetization rotational element 12 illustrated in FIG. 3, one of the via wirings 4 is connected to the spin-orbit torque wiring 2 with the first magnetic field applying layer 3 interposed therebetween.

In a case of the spin current magnetization rotational element 12 illustrated in FIG. 3, when a current passes through the first magnetic field applying layer 3, a spin is polarized. When a spin-polarized current I' flows, a first spin S1' and a second spin S2' are caused due to the spin Hall effect. The first spin S1' and the second spin S2' are oriented in a synthetic vector direction of a direction of a spin due to the spin Hall effect (y-direction) and a direction of a spin polarized by passing through the first magnetic field applying layer 3 (x-direction). Even if the first spin S1' and the second spin S2' are oriented in any direction within the xy plane, they maintain an orthogonal relationship with respect to the orientation direction (z-direction) of the magnetization M1 of the first ferromagnetic layer 1. Therefore, the relationship between the orientation of an injected spin and the orientation of a magnetic field applied to the first ferromagnetic layer 1 by the first magnetic field applying layer 3 does not change. On the other hand, since the spin-transfer torque (STT) assisting the spin-orbit torque (SOT) is applied to the magnetization M1 of the first ferromagnetic layer 1 in an overlapping manner, the rotational current density required to rotate the magnetization M1 of the first ferromagnetic layer 1 can decrease.

As described above, according to the spin current magnetization rotational elements 11 and 12 of the second embodiment, heat generation due to the current I can be minimized. In addition, there is no need to provide an unnecessary interlayer insulating film, and the element is simplified and is easily produced. In regard to other operational effects, it is possible to achieve effects similar to those of the spin current magnetization rotational element 10 of the first embodiment.

Third Embodiment

Figure 4A:
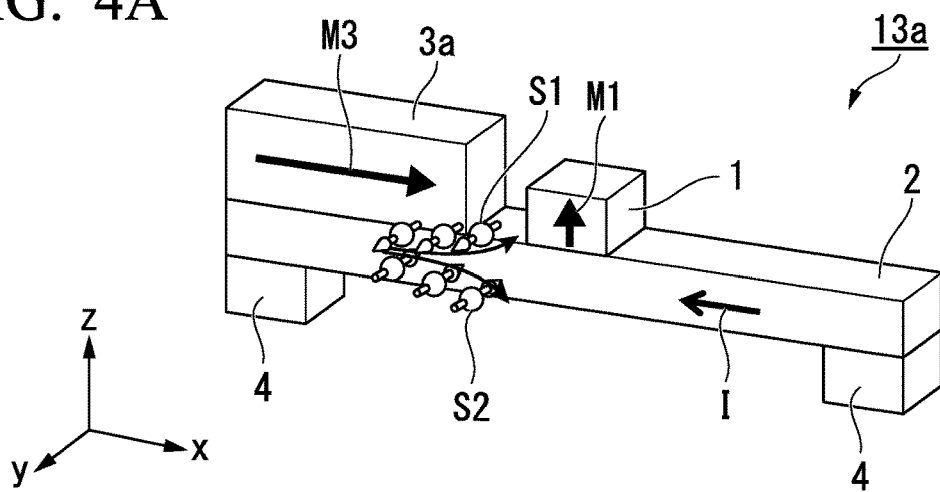
FIG. 4A is a perspective view schematically illustrating a spin current magnetization rotational element according to a third embodiment.
Figure 4B:
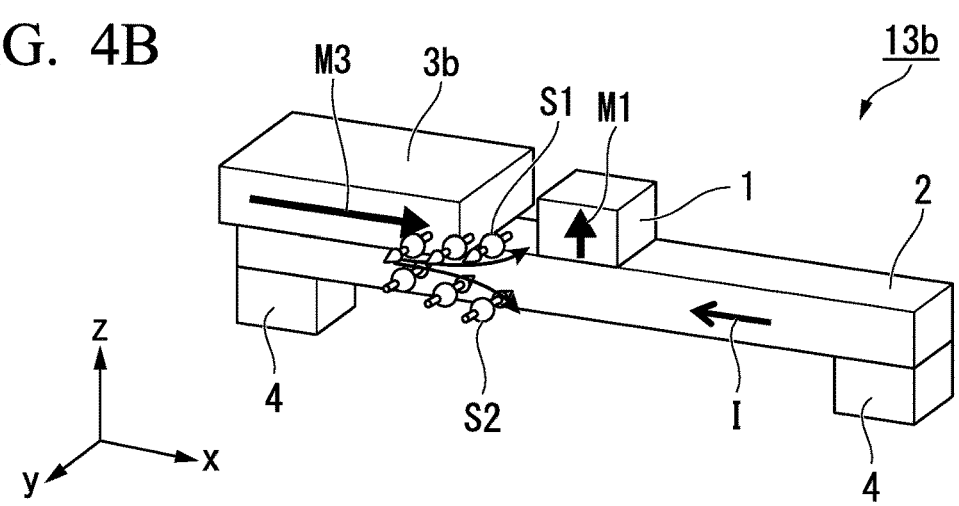
FIG. 4B is a perspective view schematically illustrating a spin current magnetization rotational element according to a third embodiment.
Figure 4C:
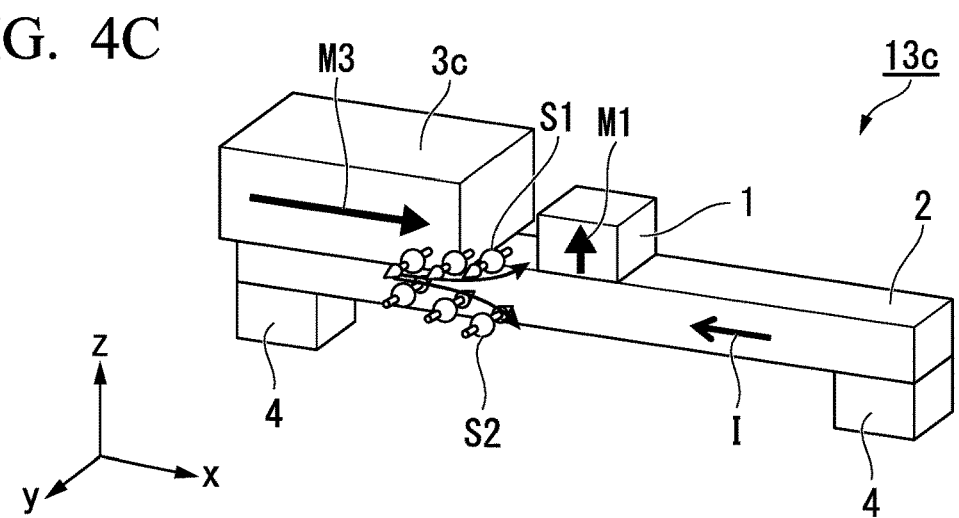
FIG. 4C is a perspective view schematically illustrating a spin current magnetization rotational element according to a third embodiment.

Spin current magnetization rotational elements 13a, 13b, and 13c according to a third embodiment illustrated in FIG. 4A to FIG. 4C are different from the spin current magnetization rotational element 11 according to the second embodiment in that a cross-sectional area of the first magnetic field applying layer 3 cut in a yz-plane is larger than a cross-sectional area of the first ferromagnetic layer 1 cut in the yz-plane. Other configurations are the same as the spin current magnetization rotational element 11 according to the second embodiment. The same reference signs are applied to the same configurations, and description thereof is omitted.

In the spin current magnetization rotational element 13a illustrated in FIG. 4A, the width of a first magnetic field applying layer 3a in the y-direction is equal to the width of the first ferromagnetic layer 1 in the y-direction, and the height thereof in the z-direction is higher than the height of the first ferromagnetic layer 1 in the z-direction. In addition, in the spin current magnetization rotational element 13b illustrated in FIG. 4B, the width of a first magnetic field applying layer 3b in the y-direction is wider than the width of the first ferromagnetic layer 1 in the y-direction, and the height thereof in the z-direction is equal to the height of the first ferromagnetic layer 1 in the z-direction. Moreover, in the spin current magnetization rotational element 13c illustrated in FIG. 4C, the width of a first magnetic field applying layer 3c in the y-direction is wider than the width of the first ferromagnetic layer 1 in the y-direction, and the height thereof in the z-direction is higher than the height of the first ferromagnetic layer 1 in the z-direction.

In any of the cases illustrated in FIG. 4A to FIG. 4C, since the first magnetic field applying layers 3a, 3b, and 3c overlap the first ferromagnetic layer 1 when seen in the x-direction, a uniform magnetic field in the x-direction can be applied to the first ferromagnetic layer 1. When a magnetic field applied to the first ferromagnetic layer 1 becomes uniform, rotation of only a portion of a magnetization in the first ferromagnetic layer 1 is minimized, and stability of a magnetization rotation is enhanced.

In addition, among those, the spin current magnetization rotational element 13a illustrated in FIG. 4A excels in integration properties of the element. In a magnetic memory in which spin current magnetization rotational elements are integrated, a plurality of spin current magnetization rotational elements are arranged within the xy plane. When the surface area of the first ferromagnetic layer 1 in the xy plane is large, the interval of adjacent spin current magnetization rotational elements needs to be widened. The cross-sectional area of the spin current magnetization rotational element 13a illustrated in FIG. 4A is increased by increasing the height thereof in the z-direction. The height in the z-direction does not affect the integration properties.

As described above, according to the spin current magnetization rotational elements 13a, 13b, and 13c of the third embodiment, a magnetic field applied to the first ferromagnetic layer 1 can be uniformized, so that rotational probability of the magnetization M1 of the first ferromagnetic layer 1 is enhanced. In regard to other operational effects, it is possible to achieve effects similar to those of the spin current magnetization rotational element 10 of the first embodiment.

Fourth Embodiment

Figure 5:
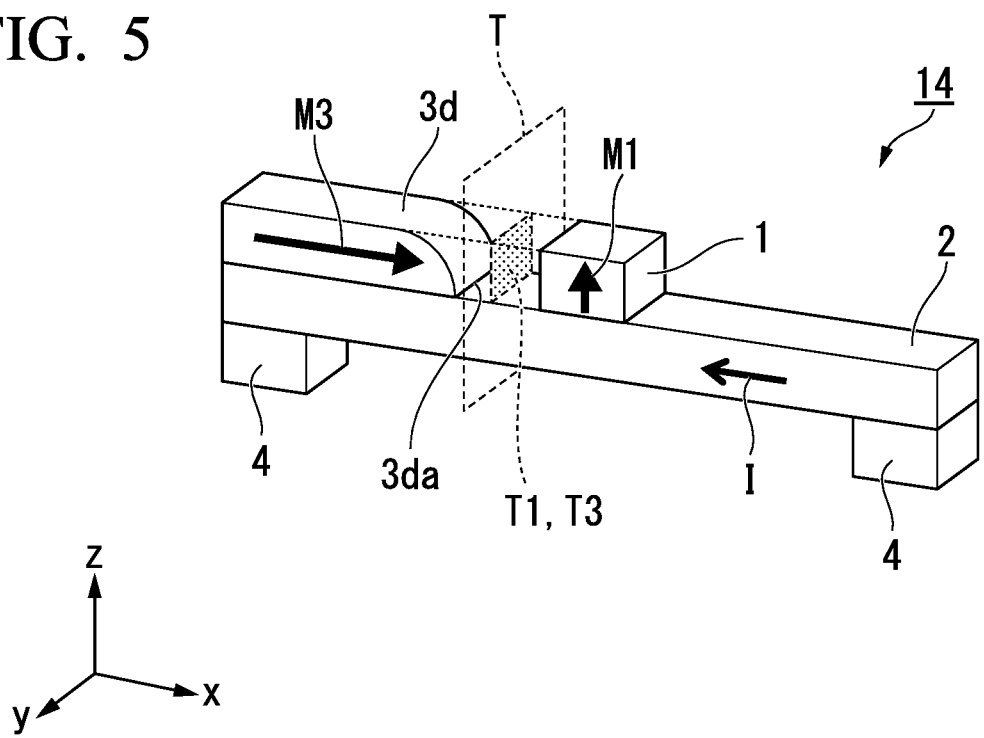
FIG. 5 is a perspective view schematically illustrating a spin current magnetization rotational element according to a fourth embodiment.

In a spin current magnetization rotational element 14 according to a fourth embodiment illustrated in FIG. 5, the shape of a first magnetic field applying layer 3d is different from that in the spin current magnetization rotational element 11 according to the second embodiment. Other configurations are the same as the spin current magnetization rotational element 11 according to the second embodiment. The same reference signs are applied to the same configurations, and description thereof is omitted.

In the spin current magnetization rotational element 14 according to the fourth embodiment, a surface of the first magnetic field applying layer 3d on the first ferromagnetic layer 1 side forms an inclined surface. A cross-sectional area of the first magnetic field applying layer 3d in the yz-plane is gradually reduced toward the first ferromagnetic layer 1. Therefore, the magnetic flux density increases toward an end part 3da of the first magnetic field applying layer 3d on the first ferromagnetic layer 1 side. When the magnetic flux density increases, the intensity of a magnetic field is strengthened. Accordingly, it is possible to generate a stronger magnetic field in the x-direction with less material.

When comparing the spin current magnetization rotational element 14 according to the fourth embodiment and the surface area of the first ferromagnetic layer 1 in the yz-plane, a projection surface T1 of the first ferromagnetic layer 1 projected on a first surface T extending along a yz-direction and a projection surface T3 of the first magnetic field applying layer 3d are compared. In FIG. 5, the surface area of the projection surface T3 and the surface area of the projection surface T1 are the same as each other. However, if the surface area of the projection surface T3 is larger than the surface area of the projection surface T1, a magnetic field applied to the first ferromagnetic layer 1 is uniformized. In addition, since the surface areas are compared to each other based on the projection surfaces T1 and T3, the side surface of the first ferromagnetic layer 1 may be inclined.

As described above, according to the spin current magnetization rotational element 14 of the fourth embodiment, when the magnetic flux density of the first magnetic field applying layer 3d is increased, the intensity of a magnetic field applied to the first ferromagnetic layer 1 can be enhanced. In regard to other operational effects, it is possible to achieve effects similar to those of the spin current magnetization rotational element 10 of the first embodiment.

Fifth Embodiment

Figure 6:
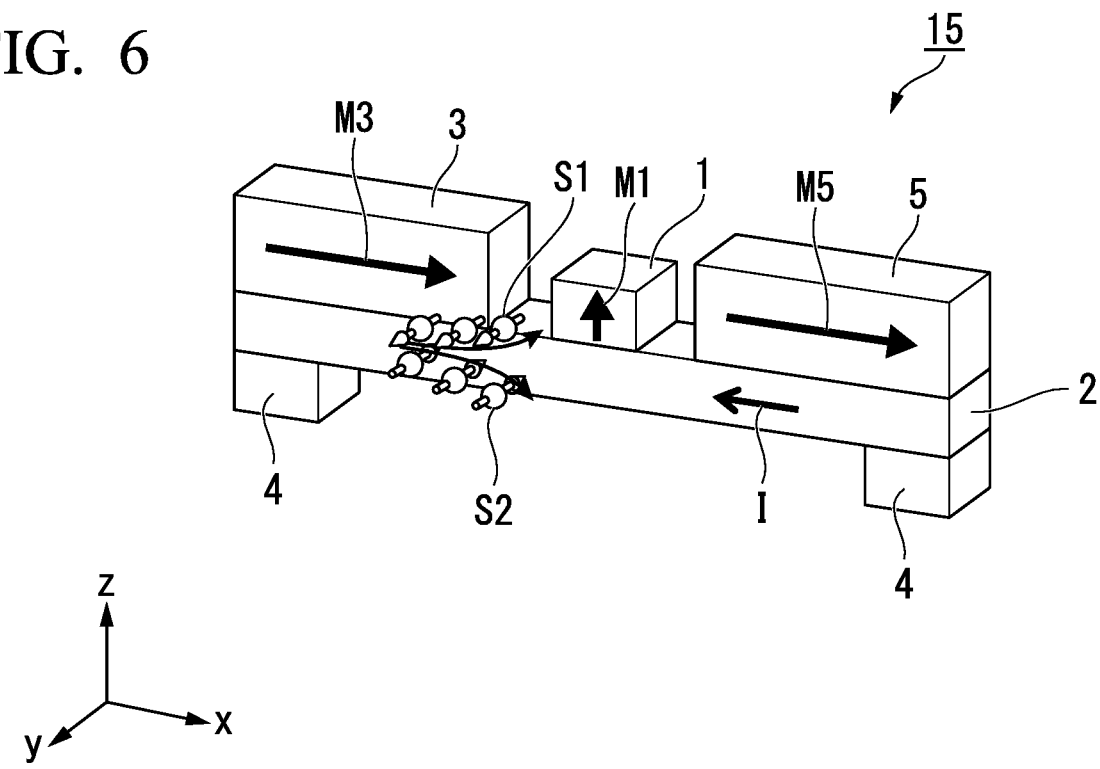
FIG. 6 is a perspective view schematically illustrating a spin current magnetization rotational element according to a fifth embodiment.

In FIG. 6, a spin current magnetization rotational element 15 according to a fifth embodiment is different from the spin current magnetization rotational element 11 according to the second embodiment in that a second magnetic field applying layer 5 is provided. Other configurations are the same as the spin current magnetization rotational element 11 according to the second embodiment. The same reference signs are applied to the same configurations, and description thereof is omitted.

The second magnetic field applying layer 5 is formed of a material equal to that of the first magnetic field applying layer 3. The width, the length, and the thickness are formed to be equal to those of the first magnetic field applying layer 3. The second magnetic field applying layer 5 is installed at a position sandwiching the first ferromagnetic layer 1 between the second magnetic field applying layer 5 and the first magnetic field applying layer 3. The orientation of a magnetization M5 of the second magnetic field applying layer 5 is oriented in the x-direction. The magnetization M5 of the second magnetic field applying layer 5 need only have a component in the x-direction and is preferably the same as the orientation of the magnetization M3 of the first magnetic field applying layer 3. It is preferable that the distance between the first ferromagnetic layer 1 and the second magnetic field applying layer 5 be equal to or shorter than the spin diffusion length of the spin-orbit torque wiring 2.

The spin current magnetization rotational element 15 according to the fifth embodiment has the first magnetic field applying layer 3 and the second magnetic field applying layer 5 such that the first ferromagnetic layer 1 is sandwiched in the x-direction. Therefore, the orientation of a magnetic field passing through the first ferromagnetic layer 1 in the x-direction can be uniformly aligned.

Consequently, the effect of disrupting the symmetry of a magnetization caused in the first ferromagnetic layer 1 can be equally caused at all of the positions in the first ferromagnetic layer 1, and stability of a magnetization rotation can be enhanced at all of the positions in the first ferromagnetic layer 1. In regard to other operational effects, it is possible to achieve effects similar to those of the spin current magnetization rotational element 10 of the first embodiment.

Sixth Embodiment

Figure 7:
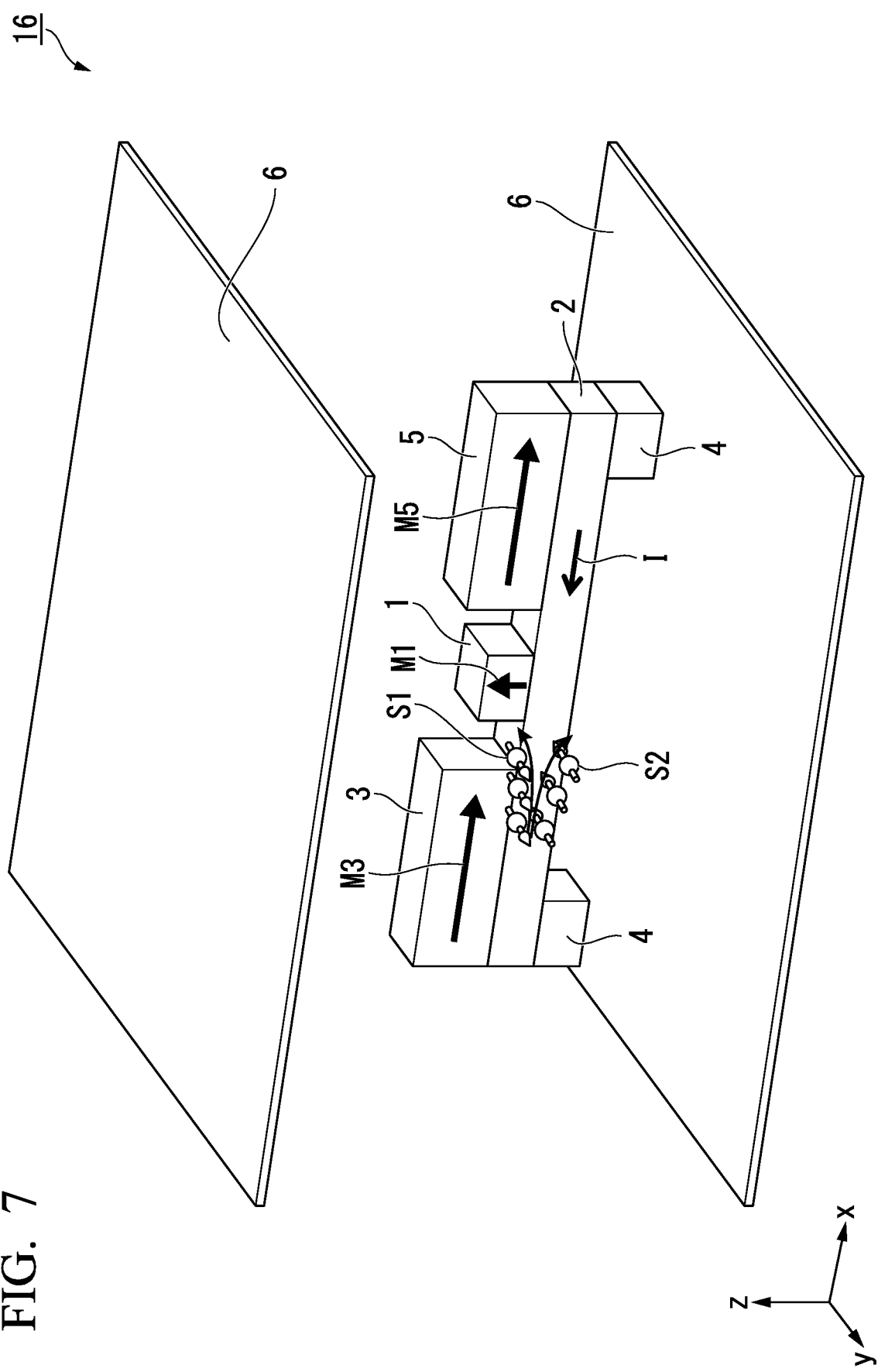
FIG. 7 is a perspective view schematically illustrating a spin current magnetization rotational element according to a sixth embodiment.

In FIG. 7, a spin current magnetization rotational element 16 according to a sixth embodiment is different from the spin current magnetization rotational element 15 according to the fifth embodiment in that magnetic shield layers 6 sandwiching the spin-orbit torque wiring 2 and the first ferromagnetic layer 1 in the z-direction are included. Other configurations are the same as the spin current magnetization rotational element 15 according to the fifth embodiment. The same reference signs are applied to the same configurations, and description thereof is omitted.

The magnetic shield layers 6 are installed to sandwich the spin-orbit torque wiring 2 and the first ferromagnetic layer 1 in the z-direction. The magnetic shield layers 6 prevent an unnecessary magnetic field from invading the inside of the spin current magnetization rotational element 16 and reduce generation of noise.

A known material having high magnetic shielding properties can be used as the magnetic shield layer 6. For example, it is possible to use a soft magnetic material such as an alloy containing Ni and Fe; sendust; an alloy containing FeCo; Fe; Co; and an alloy containing Ni.

When the magnetic shield layers 6 are provided, it is possible to provide the spin current magnetization rotational element 16 which is unlikely to be affected by an external magnetic field, in which rotation of a spin current is not affected by an external magnetic field, and which has excellent stability. In other words, in the spin current magnetization rotational element 16, a magnetic field in the x-direction necessary for the first ferromagnetic layer 1 is applied inside the element, so that a mechanism for applying a magnetic field from the outside is not required. Other operational effects are equal to the operational effects which can be obtained in the structure of the first embodiment.

Seventh Embodiment

<Spin-Orbit-Torque Magnetoresistance Effect Element>

Figure 8:
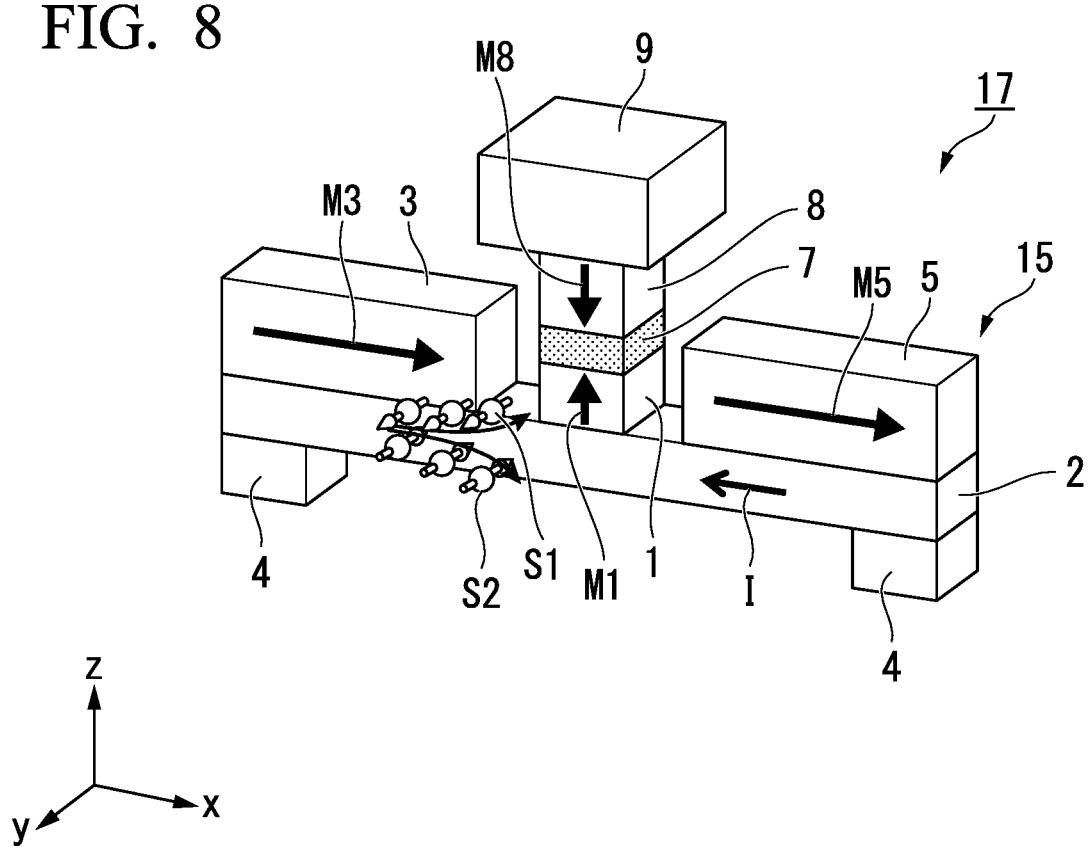
FIG. 8 is a perspective view schematically illustrating a spin-orbit-torque magnetoresistance effect element according to a seventh embodiment.

FIG. 8 is a view schematically illustrating a perspective view of a spin-orbit-torque magnetoresistance effect element 17 according to a seventh embodiment. The spin current magnetization rotational element 15 of the fifth embodiment is used as the spin-orbit-torque magnetoresistance effect element 17 illustrated in FIG. 8. The spin-orbit-torque magnetoresistance effect element 17 illustrated in FIG. 8 includes a nonmagnetic layer 7 laminated on the first ferromagnetic layer 1 (z-direction: a surface on a side opposite to a surface in contact with the spin-orbit torque wiring), and a second ferromagnetic layer 8 laminated on the nonmagnetic layer 7 (z-direction). In addition, an electrode layer 9 is provided on the second ferromagnetic layer 8. Other configurations are equal to those of the spin current magnetization rotational element 15 of the fifth embodiment, and description thereof is omitted.

A laminated body (functional part) in which the first ferromagnetic layer 1, the nonmagnetic layer 7, and the second ferromagnetic layer 8 are laminated functions similarly to an ordinary magnetoresistance effect element. The functional part functions as a magnetization M8 of the second ferromagnetic layer 8 is fixed in one direction (z-direction) and the orientation of the magnetization M1 of the first ferromagnetic layer 1 relatively changes. When being applied to a coercivity differential-type (pseudo spin valve-type) MRAM, the coercivity of the second ferromagnetic layer 8 is greater than the coercivity of the first ferromagnetic layer 1. When being applied to an exchange bias-type (spin valve-type) MRAM, the magnetization M8 of the second ferromagnetic layer 8 is fixed due to exchange bonding with an antiferromagnetic layer.

In addition, in the functional part, when the nonmagnetic layer 7 is constituted of an insulator, the functional part has a configuration similar to that of a tunneling magnetoresistance (TMR) element. When the functional part is constituted of a metal, the functional part has a configuration similar to that of a giant magnetoresistance (GMR) element.

A lamination configuration of a known magnetoresistance effect element can be used as the lamination configuration of the functional part. For example, each of the layers may be constituted of a plurality of layers or may include a different layer such as an antiferromagnetic layer for fixing a magnetization direction of the second ferromagnetic layer 8. The second ferromagnetic layer 8 is called a fixed layer or a reference layer, and the first ferromagnetic layer 1 is called a free layer or a storage layer.

A known material can be used as a material of the second ferromagnetic layer 8. For example, it is possible to use a metal selected from the group consisting of Cr, Mn, Co, Fe, and Ni, and an alloy containing one or more kinds of the metals and exhibiting ferromagnetism. It is also possible to use an alloy containing the metals, and at least one element from B, C, and N. Specifically, Co—Fe and Co—Fe—B are included as examples.

In addition, in order to obtain a higher output, it is preferable that a Heusler alloy such as $Co_2FeSi$ be used as a material of the second ferromagnetic layer 8. A Heusler alloy contains an intermetallic compound having a chemical composition of $X_2YZ$, in which X is a transition metal element of group Co, Fe, Ni, or Cu, or a noble metal element on the periodic table; Y is a transition metal of group Mn, V, Cr, or Ti, or the kinds of chemical elements of X; and Z is a typical element of group III to group V. For example, $Co_2FeSi$, $Co_2MnSi$, and $Co_2Mn_{1-a}Fe_aAl_bSi_{1-b}$ are included.

In order to further increase the coercivity of the second ferromagnetic layer 8 with respect to the first ferromagnetic layer 1, an antiferromagnetic material such as IrMn and PtMn may be used as a material to be in contact with the second ferromagnetic layer 8. Moreover, in order to prevent the first ferromagnetic layer 1 from being affected by a leakage magnetic field of the second ferromagnetic layer 8, it is possible to have a structure of synthetic ferromagnetic bonding.

A known material can be used as the nonmagnetic layer 7.

For example, when the nonmagnetic layer 7 is constituted of an insulator (when being a tunnel barrier layer), $Al_2O_3$, $SiO_2$, MgO, $Ga_2O_3$, and $MgAl_2O_4$ can be used as the material thereof. In addition thereto, it is possible to use a material or the like in which a portion of Al, Si, and Mg is replaced with Zn, Be, or the like. Moreover, it is possible to use a material in which Mg of $MgAl_2O_4$ is replaced with Zn, a material in which Al is replaced with Ga or In, and the like.

Among these, MgO and $MgAl_2O_4$ have high lattice matching properties with respect to a different layer.

The functional part may have a different layer. For example, the functional part may have a base layer on a surface of the first ferromagnetic layer 1 on a side opposite to the nonmagnetic layer 7 or may have a cap layer on a surface of the second ferromagnetic layer 8 on a side opposite to the nonmagnetic layer 7.

It is preferable that a spin propagated from the spin-orbit torque wiring 2 not be dispersed in a layer installed between the spin-orbit torque wiring 2 and the first ferromagnetic layer 1. For example, in silver, copper, magnesium, and aluminum, it is known that the spin diffusion length is long (100 nm or longer) and it is difficult for a spin to be dispersed.

In addition, it is preferable that the thickness of this layer be equal to or smaller than the spin diffusion length of a substance constituting the layer. If the thickness of the layer is equal to or smaller than the spin diffusion length, a spin propagated from the spin-orbit torque wiring 2 can be sufficiently transmitted to the first ferromagnetic layer 1.

A known material having high conductivity can be used as the electrode layer 9. For example, aluminum, silver, copper, or gold can be used.

The spin-orbit-torque magnetoresistance effect element according to the seventh embodiment can control the orientation of a magnetization of the magnetization M1 of the first ferromagnetic layer 1 (writing operation) by causing a current to flow along the spin-orbit torque wiring 2. In addition, when a current flows between the electrode layer 9 and the via wirings 4, it is possible to measure a difference of a resistance value of the functional part in accordance with a difference of relative angles of the magnetization M1 and the magnetization M8 (reading operation). That is, it can be used as a recording element which can perform recording and reading of data. In regard to other operational effects, it is possible to achieve an effect similar to that of the first embodiment.

FIG. 9A to FIG. 9E are process diagrams illustrating an overview of examples of a process of producing the spin-orbit-torque magnetoresistance effect element 17 illustrated in FIG. 8.

Figure 9A:
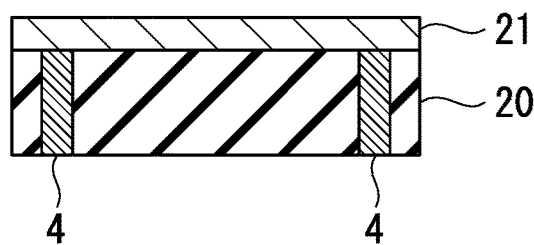
FIG. 9A is a view schematically illustrating a method of producing the spin-orbit-torque magnetoresistance effect element according to the seventh embodiment.

A surface of a substrate 20, in which the via wiring 4 is formed, is flattened by chemical mechanical polishing (CMP polishing). Then, as illustrated in FIG. 9A, a layer 21 which becomes the base of the spin-orbit torque wiring is laminated on the flattened substrate. Then, the layer 21 is processed into a necessary shape by means of a technology such as photolithography, thereby obtaining the spin-orbit torque wiring 2. Then, an insulating layer is formed such that the spin-orbit torque wiring 2 is surrounded. It is possible to use $SiO_x$, $SiN_x$, or the like as the insulating layer. After the insulating layer is formed, the surface is flattened by using CMP polishing or the like.

Figure 9B:
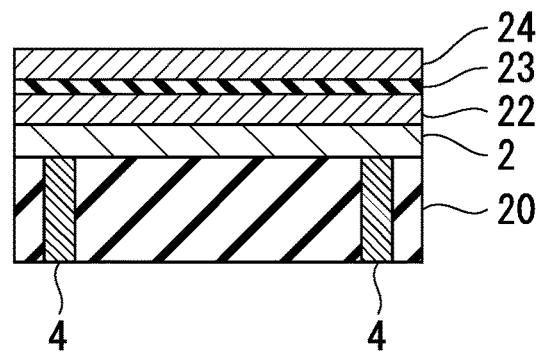
FIG. 9B is a view schematically illustrating a method of producing the spin-orbit-torque magnetoresistance effect element according to the seventh embodiment.
Figure 9C:
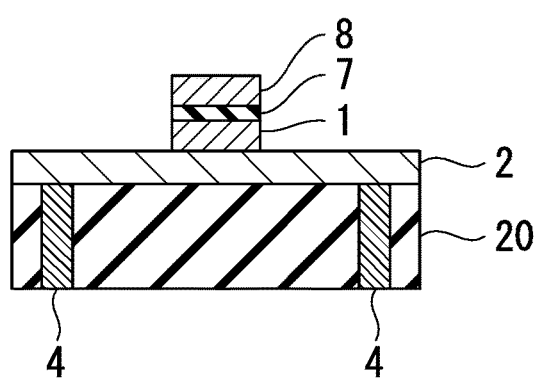
FIG. 9C is a view schematically illustrating a method of producing the spin-orbit-torque magnetoresistance effect element according to the seventh embodiment.

Subsequently, as illustrated in FIG. 9B, a layer 22 which becomes the base of a first ferromagnetic layer, a layer 23 which becomes the base of a nonmagnetic layer, and a layer 24 which becomes the base of a second ferromagnetic layer are laminated on the spin-orbit torque wiring 2 and the insulating layer. Then, the laminated bodies are processed by using a technology such as photolithography, thereby manufacturing the first ferromagnetic layer 1, the nonmagnetic layer 7, and the second ferromagnetic layer 8 (FIG. 9C).

Figure 9D:
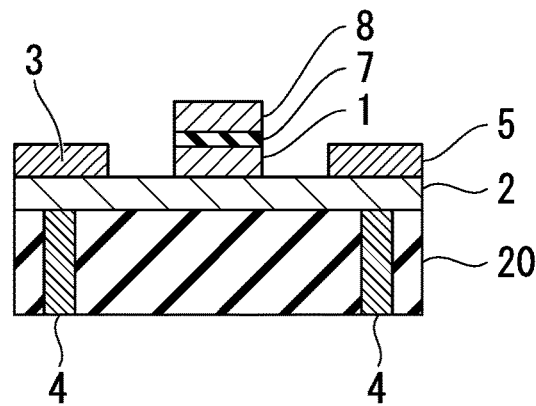
FIG. 9D is a view schematically illustrating a method of producing the spin-orbit-torque magnetoresistance effect element according to the seventh embodiment.
Figure 9E:
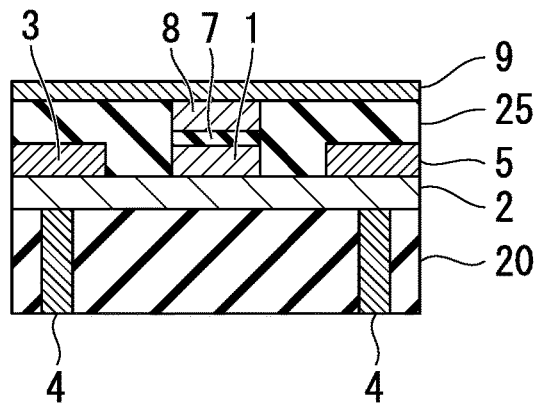
FIG. 9E is a view schematically illustrating a method of producing the spin-orbit-torque magnetoresistance effect element according to the seventh embodiment.

Next, as illustrated in FIG. 9D, the first magnetic field applying layer 3 and the second magnetic field applying layer 5 are laminated at a predetermined position by using a mask or the like. Then, as illustrated in FIG. 9E, an insulating layer 25 is formed to cover those. Then, the spin-orbit-torque magnetoresistance effect element 17 illustrated in FIG. 7 can be manufactured by laminating the electrode layer 9 on the insulating layer 25 and the second ferromagnetic layer 8.

Eighth Embodiment

<Magnetic Memory>

Figure 10:
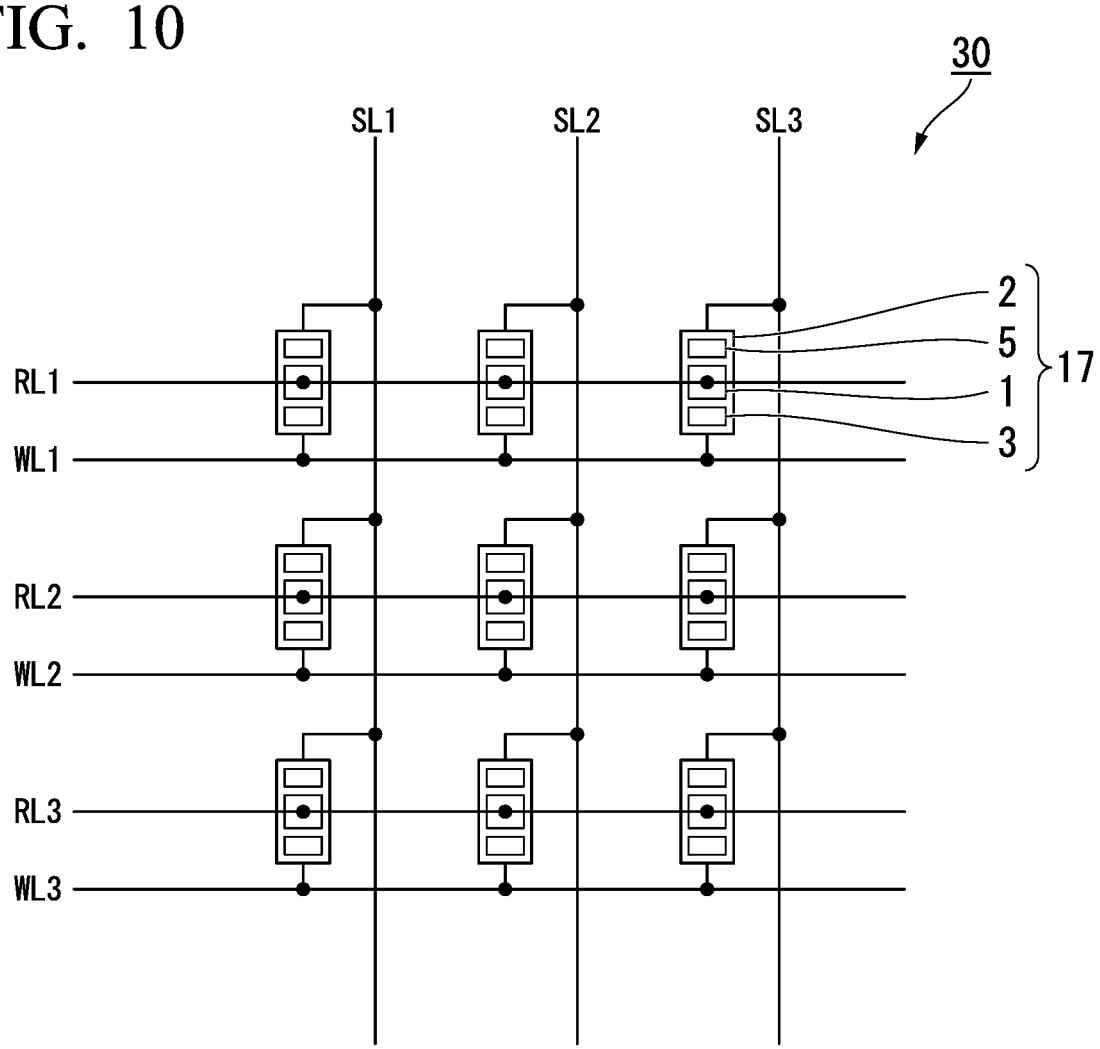
FIG. 10 is a view schematically illustrating a magnetic memory according to an eighth embodiment.

FIG. 10 is a plan view of a magnetic memory 30 including a plurality of spin-orbit-torque magnetoresistance effect elements 17 (refer to FIG. 8). In the magnetic memory 30 illustrated in FIG. 10, the spin-orbit-torque magnetoresistance effect elements 17 are arranged in matrix of 3×3. FIG. 10 is an example of a magnetic memory, and the number and arrangement of the spin-orbit-torque magnetoresistance effect elements 17 are arbitrary.

One of word lines WL1 to WL3, one of source lines SL1 to SL3, and one of lead lines RL1 to RL3 are connected to each of the spin-orbit-torque magnetoresistance effect elements 17.

A current is caused to flow in the spin-orbit torque wiring 2 of an arbitrary spin-orbit-torque magnetoresistance effect element 17 by selecting the word lines WL1 to WL3 and the source lines SL1 to SL3 to which a current is to be applied, thereby performing a writing operation. In addition, a current is caused to flow in the lamination direction of an arbitrary spin-orbit-torque magnetoresistance effect element 17 by selecting the lead lines RL1 to RL3 and the source lines SL1 to SL3 to which a current is to be applied, thereby performing a reading operation. The word lines WL1 to WL3, the source lines SL1 to SL3, and the lead lines RL1 to RL3 to which a current is to be applied can be selected by using a transistor or the like. That is, data of an arbitrary element is read from the plurality of spin-orbit-torque magnetoresistance effect elements 17, and the spin-orbit-torque magnetoresistance effect elements 17 can be utilized as a magnetic memory.

Figure 11:
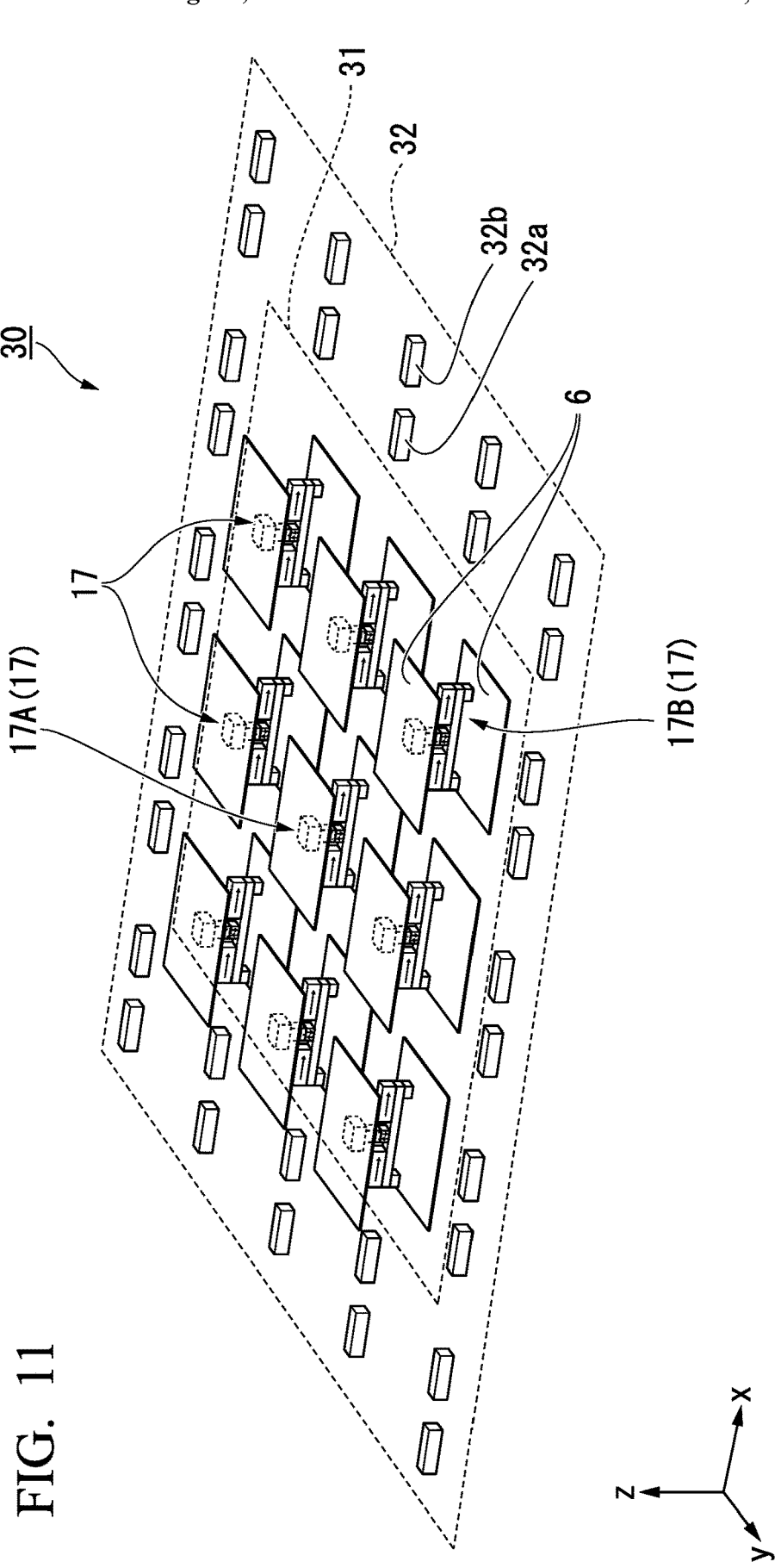
FIG. 11 is a perspective view illustrating a main part of the magnetic memory according to the eighth embodiment.

In addition, FIG. 11 is a perspective view illustrating a main part of a magnetic memory according to an eighth embodiment. In FIG. 11, a wiring or the like constituting the magnetic memory 30 is omitted for simplified illustration. As illustrated in FIG. 11, the magnetic memory 30 may have an element part 31 in which the plurality of spin-orbit-torque magnetoresistance effect elements 17 are arranged, and a magnetic field applying part 32 which is positioned in the outer periphery of the element part 31. The magnetic shield layers 6 are provided in the z-direction of the spin-orbit-torque magnetoresistance effect elements 17 illustrated in FIG. 11.

A plurality of pairs of a first magnetic field generation source 32a and a second magnetic field generation source 32b are arranged in the magnetic field applying part 32 illustrated in FIG. 11. The first magnetic field generation source 32a and the second magnetic field generation source 32b correspond to the first magnetic field applying layer 3 and the second magnetic field applying layer 5, respectively. When the first magnetic field generation sources 32a and the second magnetic field generation sources 32b are provided in the magnetic field applying part 32, the surrounding magnetic state based on a spin-orbit-torque magnetoresistance effect element 17A positioned in the middle, and the surrounding magnetic state based on a spin-orbit-torque magnetoresistance effect element 17B positioned in an end part become equal to each other. Therefore, a magnetic field applied to each of the spin-orbit-torque magnetoresistance effect elements 17 inside the magnetic memory 30 becomes uniform, and fluctuation in the rotational current density and rotational probability between the elements can be reduced.

Figure 12:
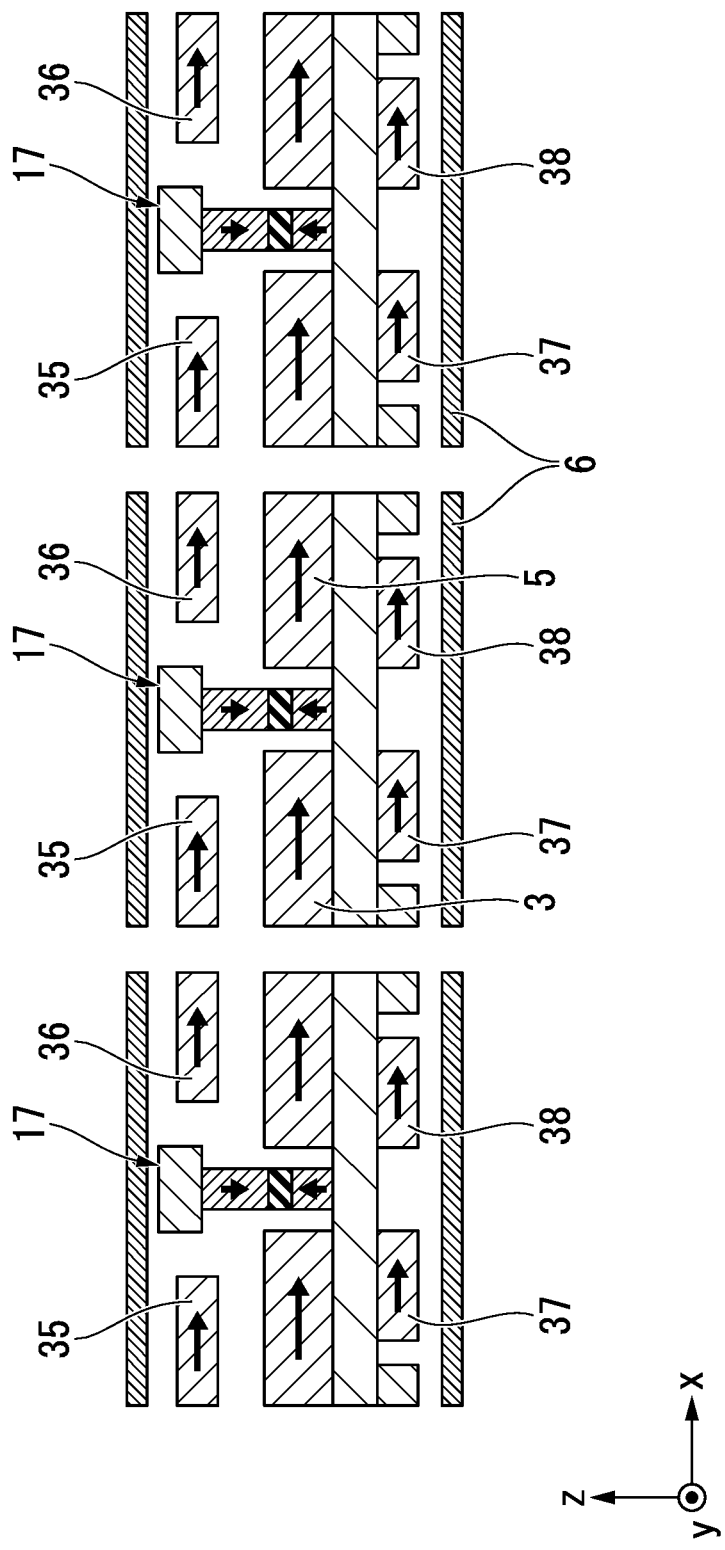
FIG. 12 is a cross-sectional view of another example of the magnetic memory according to the eighth embodiment cut along an x-direction.

Moreover, FIG. 12 is a cross-sectional view of another example of the magnetic memory according to the eighth embodiment cut along the x-direction. As illustrated in FIG. 12, in addition to the first magnetic field applying layer 3 and the second magnetic field applying layer 5, the spin-orbit-torque magnetoresistance effect elements 17 may have different magnetic field applying layers 35, 36, 37, and 38 at different positions in the z-direction. The magnetic field applying layers 35, 36, 37, and 38 may have a configuration similar to the first magnetic field applying layer 3. When the magnetic field applying layers 35, 36, 37, and 38 are provided, a magnetic field applied to the functional part of the spin-orbit-torque magnetoresistance effect element 17 is further oriented in the x-direction.

Ninth Embodiment

<High-Frequency Magnetic Element>

Figure 13:
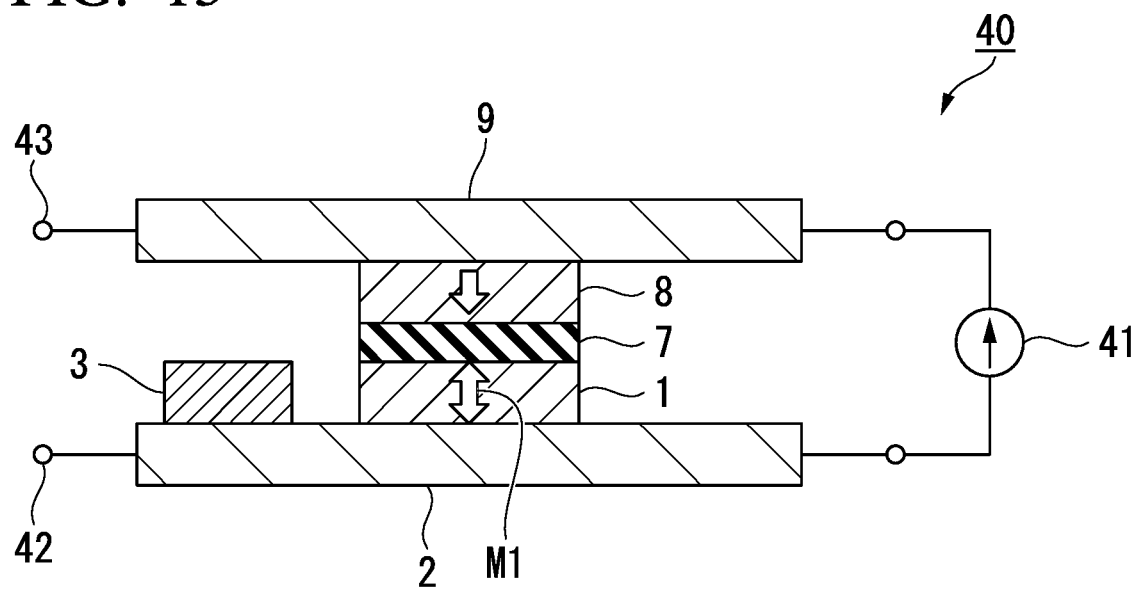
FIG. 13 is a schematic view of a cross section of a high-frequency magnetic element according to a ninth embodiment.

FIG. 13 is a schematic view of a cross section of a high-frequency magnetic element according to a ninth embodiment. A high-frequency magnetic element 40 illustrated in FIG. 9 includes the spin-orbit-torque magnetoresistance effect element 17 illustrated in FIG. 8, and a direct current power supply 41 connected to the spin-orbit-torque magnetoresistance effect element 17.

A high-frequency current is input through an input terminal 42 of the high-frequency magnetic element 40. A high-frequency current generates a high-frequency magnetic field. In addition, when a high-frequency current flows in the spin-orbit torque wiring 2, a pure spin current is induced, and a spin is injected into the first ferromagnetic layer 1. The magnetization M1 of the first ferromagnetic layer 1 vibrates due to a high-frequency magnetic field and an injected spin.

When a frequency of a high-frequency current input through the input terminal 42 is a ferromagnetic resonance frequency, the magnetization M1 of the first ferromagnetic layer 1 resonates in a ferromagnetic manner. When the magnetization M1 of the first ferromagnetic layer 1 resonates in a ferromagnetic manner, a change in resistance value of the functional part of a magnetoresistance effect increases. This change in resistance value is read through an output terminal 43 when the direct current power supply 41 applies a direct current or a direct voltage.

That is, when a frequency of a signal input through the input terminal 42 is a ferromagnetic resonance frequency of the magnetization M1 of the first ferromagnetic layer 1, a change in resistance value output through the output terminal 43 increases. When the frequency is a frequency other than that, a change in resistance value output through the output terminal 43 decreases. The high-frequency magnetic element functions as a high-frequency filter by utilizing the degree of this change in resistance value.

In addition, when the first magnetic field applying layer 3 applies a magnetic field to the first ferromagnetic layer 1, the magnetization M1 of the first ferromagnetic layer 1 is likely to vibrate. If the magnetization M1 of the first ferromagnetic layer 1 is likely to vibrate, the amount of change in resistance value increases, and the intensity of a signal output through the output terminal 43 increases.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

EXPLANATION OF REFERENCES

1 First ferromagnetic layer
2 Spin-orbit torque wiring
3, 3a, 3b, 3c, 3d First magnetic field applying layer
4 Via wiring
5 Second magnetic field applying layer
6 Magnetic shield layer
7 Nonmagnetic layer
8 Second ferromagnetic layer
9 Electrode layer
10, 11, 12, 13a, 13b, 13c, 14, 15, 16 Spin current magnetization rotational element
17, 17A, 17B Spin-orbit-torque magnetoresistance effect element
20 Substrate
21, 22, 23, 24 Layer
30 Magnetic memory
31 Element part
32 Magnetic field applying part
32a First magnetic field generation source
32b Second magnetic field generation source
35, 36, 37, 38 Magnetic field applying layer
40 High-frequency magnetic element
41 Direct current power supply
42 Input terminal
43 Output terminal
M1, M3, M5, M8 Magnetization

What is claimed is:

1. A spin current magnetization rotational element, comprising:
    a spin-orbit torque wiring which extends in a first direction;
    a first ferromagnetic layer which is laminated in a second direction intersecting the first direction; and
    a first magnetic field applying layer which is disposed to be separated from the first ferromagnetic layer in the first direction and configured to apply an assistant magnetic field to the first ferromagnetic layer, the assistant magnetic field assisting a magnetization rotation of the first ferromagnetic layer, wherein:
    the spin-orbit torque wiring and the first magnetic field applying layer are in contact with each other; and
    a distance between the first ferromagnetic layer and the first magnetic field applying layer is equal to or shorter than a spin diffusion length of the spin-orbit torque wiring.

2. The spin current magnetization rotational element according to claim 1,
    wherein an axis of easy magnetization of the first ferromagnetic layer is in the second direction.

3. The spin current magnetization rotational element according to claim 1,
    wherein an axis of easy magnetization of the first magnetic field applying layer is in the first direction, and a magnetic field generated by the first magnetic field applying layer has at least a component in the first direction.

4. The spin current magnetization rotational element according to claim 2,
    wherein an axis of easy magnetization of the first magnetic field applying layer is in the first direction, and a magnetic field generated by the first magnetic field applying layer has at least a component in the first direction.

5. The spin current magnetization rotational element according to claim 1, further comprising:
    a second magnetic field applying layer configured to generate a magnetic field having at least a component in the first direction, the first ferromagnetic layer being sandwiched between the second magnetic field applying layer and the first magnetic field applying layer.

6. The spin current magnetization rotational element according to claim 1, further comprising:
    via wirings which extend in the second direction respectively from at least two points sandwiching the first ferromagnetic layer on the spin-orbit torque wiring.

7. The spin current magnetization rotational element according to claim 1, further comprising:
    magnetic shield layers which sandwich the spin-orbit torque wiring and the first ferromagnetic layer in the second direction.

8. A spin-orbit-torque magnetoresistance effect element, comprising:
    the spin current magnetization rotational element according to claim 1;
    a nonmagnetic layer which is laminated on a surface on a side opposite to a surface in contact with the spin-orbit torque wiring in the first ferromagnetic layer; and
    a second ferromagnetic layer, the nonmagnetic layer being sandwiched between the second ferromagnetic layer and the first ferromagnetic layer.

9. A magnetic memory, comprising:
    a plurality of spin-orbit-torque magnetoresistance effect elements according to claim 8.

10. The magnetic memory according to claim 9, further comprising:
    an element part in which the plurality of spin-orbit-torque magnetoresistance effect elements are arranged; and
    a magnetic field applying part which is positioned in an outer periphery of the element part and configured to uniformize magnetic fields in a middle part and a peripheral edge part of the element part.

11. A high-frequency magnetic element, comprising:
    the spin orbit-torque magnetoresistance effect element according to claim 8.

12. A spin current magnetization rotational element, comprising:
    a spin-orbit torque wiring which extends in a first direction;
    a first ferromagnetic layer which is laminated in a second direction intersecting the first direction; and
    a first magnetic field applying layer which is disposed to be separated from the first ferromagnetic layer in the first direction and configured to apply an assistant magnetic field to the first ferromagnetic layer, the assistant magnetic field assisting a magnetization rotation of the first ferromagnetic layer,
    wherein a surface area of the first magnetic field applying layer projected in the first direction with respect to a first surface extending along the second direction is larger than a surface area of the first ferromagnetic layer projected in the first direction with respect to the first surface.

* * * * *